US009480186B2

(12) United States Patent
Ahladas et al.

(10) Patent No.: US 9,480,186 B2
(45) Date of Patent: Oct. 25, 2016

(54) APPARATUS AND METHOD FOR FACILITATING AIR COOLING OF AN ELECTRONICS RACK

(75) Inventors: Steven J. Ahladas, Highland, NY (US); David P. Graybill, Staatsburg, NY (US); Madhusudan K. Iyengar, Woodstock, NY (US); Roger R. Schmidt, Poughkeepsie, NY (US); Prabjit Singh, Poughkeepsie, NY (US); Gerard V. Weber, Jr., Saugerties, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1933 days.

(21) Appl. No.: 11/958,528

(22) Filed: Dec. 18, 2007

(65) Prior Publication Data
US 2009/0156114 A1  Jun. 18, 2009

(51) Int. Cl.
H05K 5/00  (2006.01)
H05K 7/20  (2006.01)

(52) U.S. Cl.
CPC ...... *H05K 7/20745* (2013.01); *H05K 7/20736* (2013.01)

(58) Field of Classification Search
CPC .................................................. H05K 7/20745
USPC ....... 454/254, 256, 289, 290, 338, 906, 184, 454/291; 361/695, 696
See application file for complete search history.

(56) References Cited

U.S. PATENT DOCUMENTS

| | | | |
|---|---|---|---|
| 5,121,291 A * | 6/1992 | Cope et al. | 361/695 |
| 5,345,779 A * | 9/1994 | Feeney | E04F 15/02411 361/695 |
| 5,910,045 A * | 6/1999 | Aoki | F04D 17/02 454/186 |
| 6,557,624 B1 * | 5/2003 | Stahl et al. | 165/53 |
| 6,616,524 B2 * | 9/2003 | Storck et al. | 454/184 |
| 6,819,563 B1 * | 11/2004 | Chu et al. | 361/696 |
| 6,832,489 B2 * | 12/2004 | Bash et al. | 62/180 |
| 6,881,142 B1 * | 4/2005 | Nair | F24F 11/0001 236/49.3 |
| 7,013,968 B2 * | 3/2006 | Beitelmal et al. | 165/244 |
| 7,051,946 B2 * | 5/2006 | Bash et al. | 236/49.3 |
| 7,463,950 B1 * | 12/2008 | Brey et al. | 700/299 |
| 2006/0075764 A1 * | 4/2006 | Bash et al. | 62/178 |
| 2006/0091229 A1 * | 5/2006 | Bash et al. | 236/49.3 |
| 2006/0102322 A1 * | 5/2006 | Madara et al. | 165/104.21 |
| 2006/0178764 A1 * | 8/2006 | Bieswanger et al. | 700/89 |

* cited by examiner

*Primary Examiner* — Alissa Tompkins
*Assistant Examiner* — Brittany Towns
(74) *Attorney, Agent, or Firm* — Margaret A. McNamara, Esq.; Kevin P. Radigan, Esq.; Heslin Rothenberg Farley & Mesiti P.C.

(57) ABSTRACT

Apparatus and method are provided for facilitating air cooling of an electronics rack. The apparatus includes a tile assembly, temperature sensor and controller. The tile assembly is disposed adjacent to the electronics rack, and includes a perforated tile and one or more controllable air-moving devices associated with the perforated tile for moving air through the perforated tile. The temperature sensor is positioned for sensing air temperature adjacent and external to, or within, the electronics rack, and the controller is coupled to the tile assembly and the temperature sensor for controlling operation of the air-moving device. Airflow through the tile assembly is adjusted based on air temperature sensed, thereby facilitating air cooling of the electronics rack. In one embodiment, the tile assembly is a floor tile assembly with an air-to-liquid heat exchanger disposed between the perforated tile and the air-moving device for cooling air passing through the floor tile assembly.

18 Claims, 11 Drawing Sheets

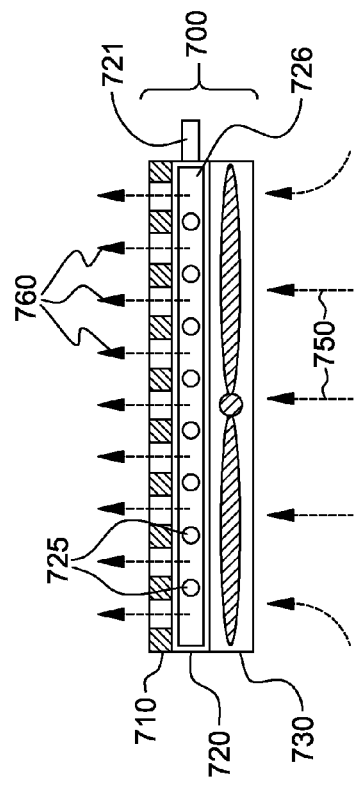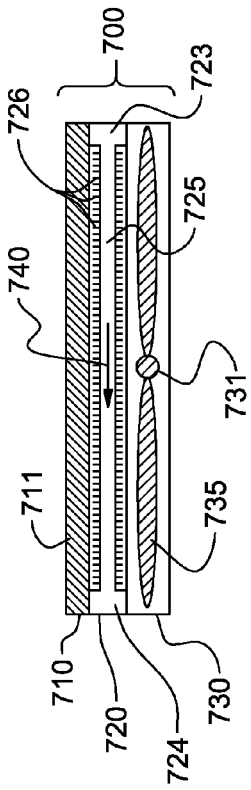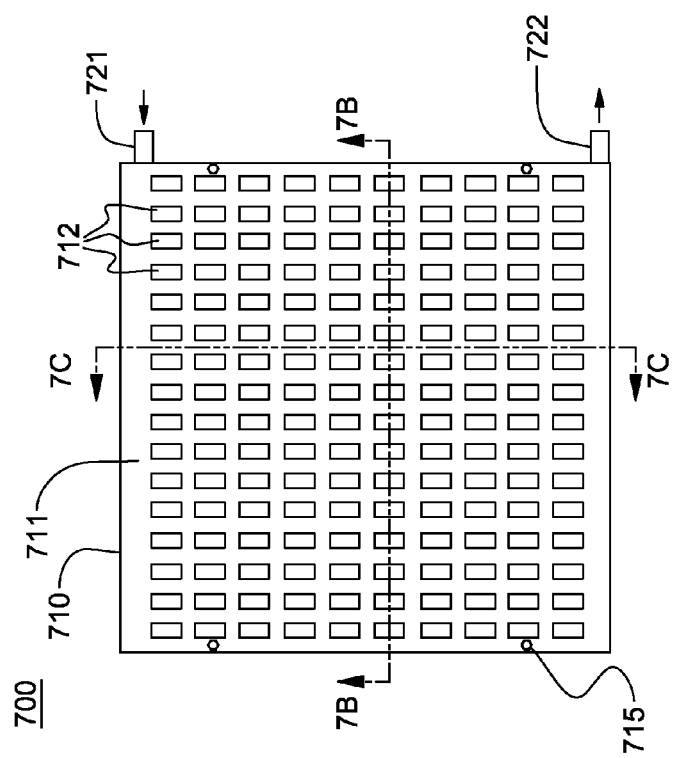

APPARATUS AND METHOD FOR FACILITATING AIR COOLING OF AN ELECTRONICS RACK

TECHNICAL FIELD

The present invention relates in general to apparatuses and methods for facilitating air cooling rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air-moving in parallel airflow paths, usually front-to-back, impelled by one or more air-moving devices (e.g., fans or blowers). In some cases it may be possible to handle increased power dissipation within a single drawer by providing greater airflow, through the use of a more powerful air-moving device or by increasing the rotational speed (i.e., RPMs) of an existing air-moving device. However, this approach is becoming problematic at the rack level in the context of a computer installation (e.g., data center).

The sensible heat load carried by the air exiting the rack is stressing the ability of the room air-conditioning to effectively handle the load. This is especially true for large installations with "server farms" or large banks of computer racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature or in a reduction in long term reliability of the components.

SUMMARY OF THE INVENTION

The shortcomings of the prior art are overcome and additional advantages are provided through provision of an apparatus for facilitating air cooling of an electronics rack. The apparatus includes at least one tile assembly, at least one temperature sensor and a controller. Each tile assembly includes a perforated tile and at least one air-moving device associated with the perforated tile for moving air through the perforated tile, wherein the at least one air-moving device is controllable. The at least one temperature sensor is provided for sensing temperature external and adjacent to the electronics rack or within the electronics rack. The controller is coupled to the at least one tile assembly and to the at least one temperature sensor for controlling the at least one air-moving device to adjust airflow through the at least one tile assembly based on air temperature sensed by the at least one temperature sensor, wherein the controller adjust airflow through the at least one tile assembly to facilitate air cooling of the electronics rack.

In another aspect, a data center is provided which includes at least one electronics rack and an apparatus for facilitating cooling of the at least one electronics rack. Each electronics rack includes an air inlet side and an air outlet side, with the air inlet and air outlet sides respectively enabling ingress and egress of external air through the electronics rack. The apparatus includes at least one tile assembly, at least one temperature sensor, and a controller coupled to the at least one tile assembly and to the at least one temperature sensor. Each tile assembly includes a perforated tile and at least one air-moving device associated with the perforated tile for moving air through the perforated tile, wherein the at least one air-moving device is controllable. The temperature sensor is disposed for sensing air temperature external to or within the at least one electronics rack. The controller controls the at least one air-moving device to adjust airflow through the at least one tile assembly based on temperature sensed by the at least one temperature sensor, wherein adjusting of the airflow facilitates air-cooling of the at least one electronics rack.

In a further aspect, a method of facilitating air cooling of an electronics rack is provided. The method includes: disposing at least one tile assembly external to the electronics rack, each tile assembly comprising a perforated tile and at least one air-moving device associated with the perforated tile for moving air through the perforated tile, wherein the at least one air-moving device comprises a controllable attribute; sensing air temperature external to or within the electronics rack; and controlling airflow through the at least one tile assembly by automatically adjusting the controllable attribute of the at least one air-moving device associated with the perforated tile thereof based on air temperature sensed external to or within the electronics rack, wherein adjusting airflow through the at least one tile assembly based on sensed air temperature facilitates air cooling of the electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7A is a plan view of an alternate embodiment of a tile assembly of an apparatus, in accordance with an aspect of the present invention;

FIG. 7B is a cross-sectional elevational view of the tile assembly of FIG. 7A, taken along line 7B-7B, in accordance with an aspect of the present invention;

FIG. 7C is a cross-sectional elevational view of the tile assembly of FIG. 7A, taken along line 7C-7C, in accordance with an aspect of the present invention;

DETAILED DESCRIPTION OF THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers each having one or more heat generating components disposed therein requiring cooling. "Electronics subsystem" refers to any sub-housing, blade, book, drawer, node, compartment, etc., having one or more heat generating electronics components disposed therein. Electronics subsystems of an electronics rack may be movable or fixed relative to the electronics rack, with the rack-mounted electronics drawers of a multi-drawer rack unit and blades of a blade center system being two examples of subsystems of an electronics rack to be cooled.

Further, as used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchanger can vary without departing from the scope of the invention disclosed herein. A "liquid-to-liquid heat exchanger" comprises, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may contain one or more rows of rack-mounted computing units, such as server units.

One example of facility coolant or system coolant discussed below is water. However, the concepts disclosed herein are readily adapted to use with other types of liquid coolant.

Reference is made below to the drawings, which are not drawn to scale for reasons understanding, wherein the same reference numbers used throughout different figures designate the same or similar components.

Figure 1:
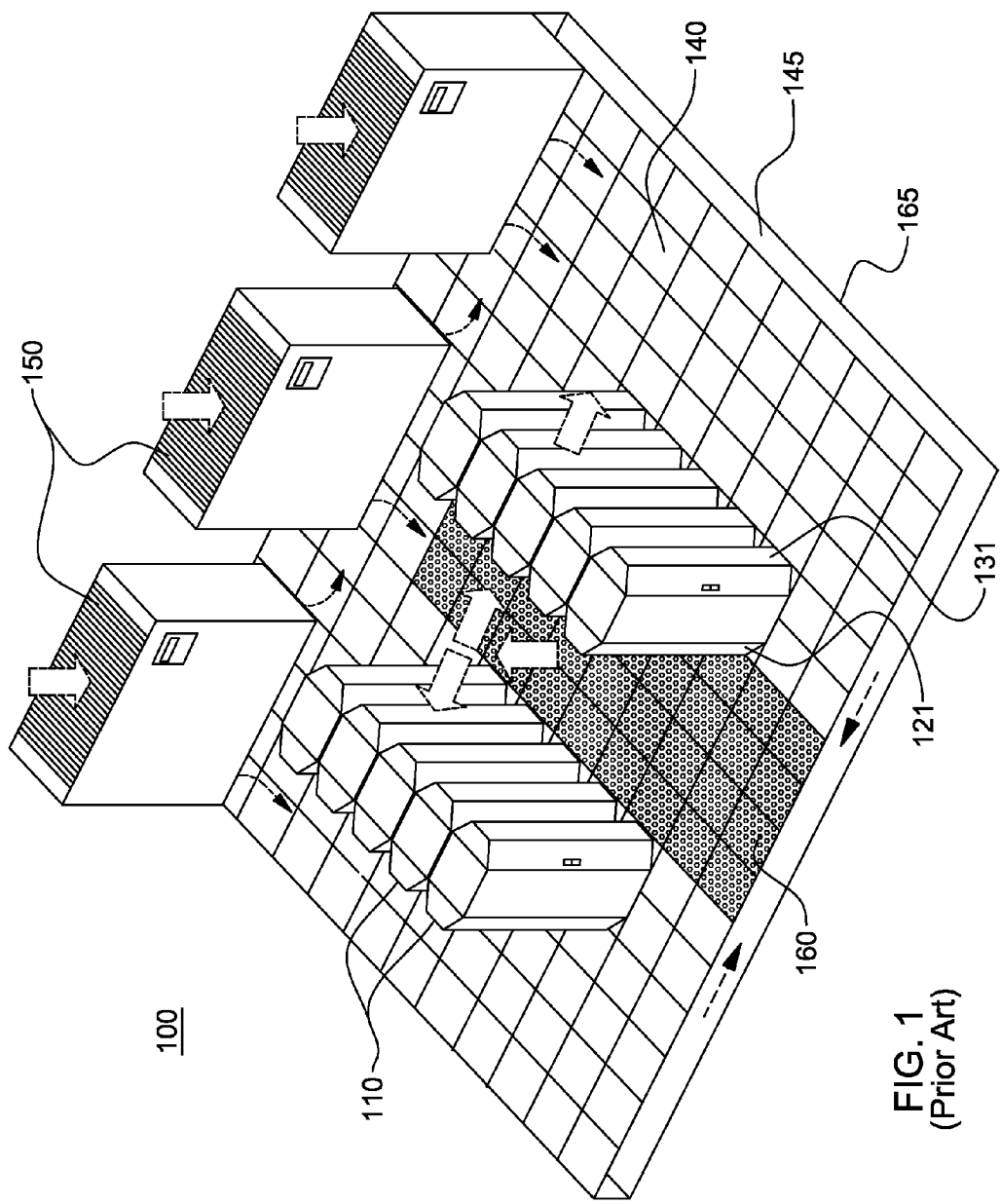
FIG. 1 depicts one embodiment of a conventional raised floor layout of an air-cooled data center.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cool air is taken in through louvered air inlet covers or doors 121 of the electronics racks and expelled through louvered air outlet covers or doors 131 of the electronics racks. Each electronics rack 110 may have an air-moving device (e.g., fan or blower) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within the computer installation 100. Room air is taken into each air-conditioning unit 150 near an upper portion thereof. This room air comprises in part exhausted air from the "hot" air aisles of the data center defined by opposing air outlet sides of the electronics racks 110.

Due to the ever increasing airflow requirements through electronics racks, and limits of air distribution within the typical data center installation, recirculation problems within the room may occur. For example, in the raised floor layout of FIG. 1, hot air recirculation may occur from the air outlet covers 131 of the electronics racks 110 back to the cold air aisle defined by the opposing air inlet covers 121 of the electronics racks. This recirculation can occur because the conditioned air supplied through tiles 160 is only a fraction of the airflow rate forced through the electronics racks by the air-moving devices disposed therein. This can be due, for example, to limitations on the tile sizes (or diffuser flow rates). The remaining fraction of the inlet side air supply is often made up by ambient room air through recirculation. This recirculating flow is often very complex in nature, and can lead to significantly higher rack unit inlet temperatures than desired.

The recirculation of hot exhaust air from the hot air aisle of the computer room installation to the cold air aisle can be detrimental to the performance and reliability of the computer system(s) or electronic system(s) within the racks. Also, computer installation equipment almost always represents a high capital investment to the customer. Thus, it is important from a product reliability and performance view point, and from a customer satisfaction and business perspective, to provide as uniform a temperature across the air inlet side of the rack unit as possible. The efficient cooling of such computer and electronic systems, and the amelioration of localized hot air inlet temperatures to one or more rack units due to recirculation of air currents, are addressed by the apparatuses and methods disclosed herein.

Figure 2:
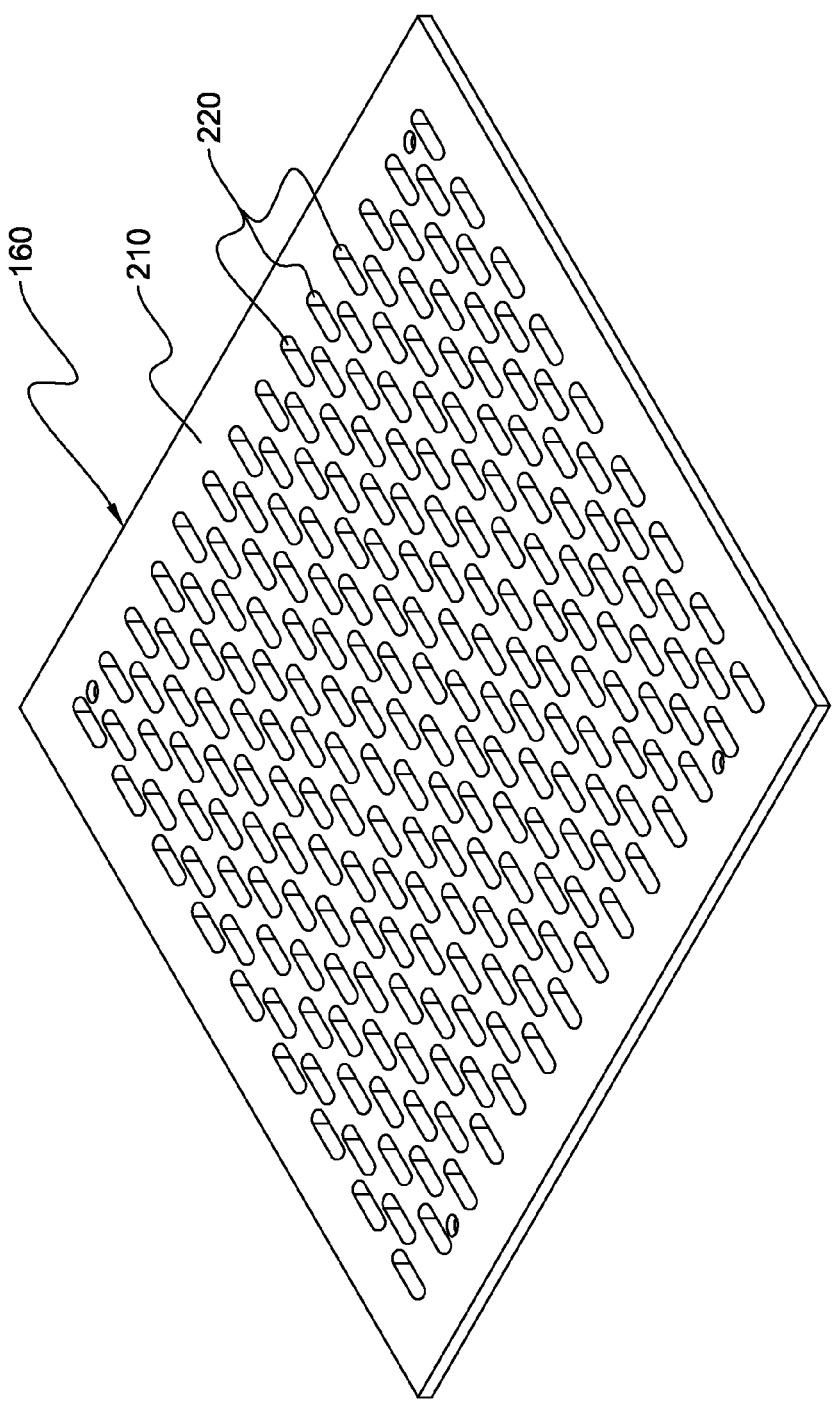
FIG. 2 is an isometric view of one embodiment of a conventional perforated tile.

FIG. 2 depicts one embodiment of a conventional perforated floor tile 160 for use, for example, in raised floor layout such as depicted in FIG. 1. Perforated floor tile 160 includes a solid structural portion 210, which is designed to support a specified weight, and openings 220, which function as conduits for airflow from the under floor plenum into the data center room. Openings 220 may make up a variable percentage of perforated floor tile 160. For example, openings 220 may comprise 5% to 60% of the surface area of perforated floor tile 160. In one embodiment, perforated floor tile 160 is a rectangular, metal structure.

As described further hereinbelow, an apparatus and method are presented for facilitating air cooling of rack-mounted assemblages of individual electronics racks, with one or more tile assemblies being provided in place of the conventional perforated floor tile of FIG. 2. These tile assemblies facilitate control of the amount of cool air forced into the cold air aisle of the data center layout adjacent to a respective electronics rack. In this manner, the volume of cool airflow introduced adjacent to each respective electronics rack is separately controllable. Although described below as floor tile assemblies the concepts presented could also be applied, for example, to ceiling tiles, with a cold air plenum residing above the ceiling of the data center.

As explained further herein, temperature is sensed (in one embodiment) at the air inlet side of an electronics rack, and if a set temperature threshold is exceeded, then the amount of cool air forced into the cold air aisle by the adjacent tile assemblies is increased to provide additional cool airflow at the air inlet side of the electronics rack, thereby facilitating mitigation of an over-temperature hot spot. Conceptually, the volume of cool air provided to an air inlet side of an electronics rack can be increased when needed to push a wall of cool air upwards parallel to the air inlet side of the electronics rack, thus disrupting any recirculation of hot air.

Figure 3:
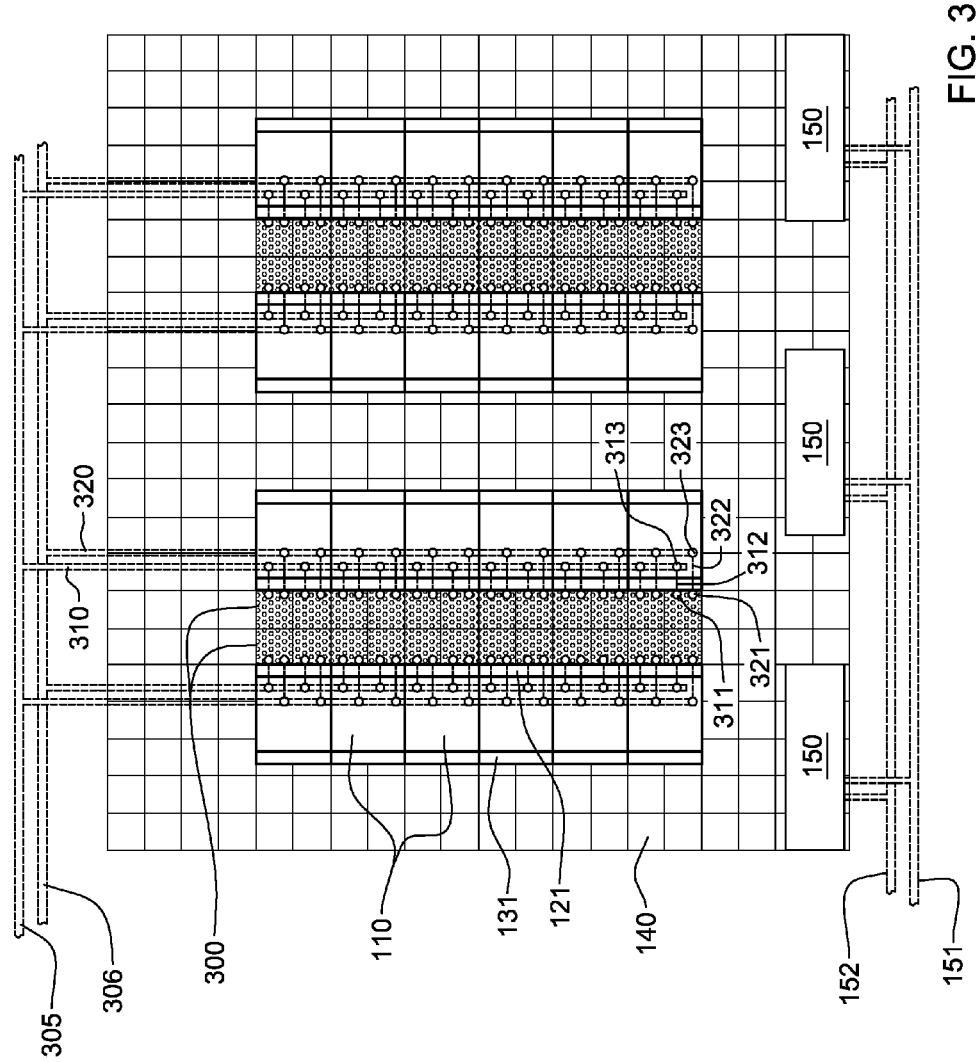
FIG. 3 is a plan view of one embodiment of a raised floor layout of a data center, in accordance with an aspect of the present invention.

FIG. 3 depicts one embodiment a raised floor layout of an air-cooled data center, in accordance with an aspect of the present invention. A plurality of electronics racks 1 10 are disposed in multiple rows above a raised floor 140, below which a cold air supply plenum resides. Each electronics rack 110 may have an air-moving device to provide forced inlet-to-outlet airflow to facilitate air cooling of the electronic components within the rack. The cold supply air plenum provides conditioned and cooled air to the air inlet sides of the electronics racks via tile assemblies 300, which are disposed in the cold air aisles of the data center adjacent to the air inlet sides of the electronics racks. Conditioned and/or cooled air is supplied to the under-floor cold air supply plenum by one or more air-conditioning units 150, also disposed with the data center. Room air is taken into each air-conditioning unit 150 in an upper portion thereof. Extracted heat from the air is transferred to facility coolant passing through air-conditioning units 150, and expelled from the data center via a facility coolant supply line 151 and a facility coolant return line 152.

Each tile assembly 300 comprises, in one embodiment, a perforated floor tile, an air-to-liquid heat exchanger, and an air-moving device, which are described further below with reference to FIGS. 4-5C. FIG. 3 illustrates one embodiment of connections for providing coolant to the air-to-liquid heat exchangers disposed within tile assemblies 300. As illustrated, each tile assembly 300 includes a coolant inlet port 311 and a coolant outlet port 321, which are connected via appropriate connect lines 312, 322 to respective header ports 313, 323 in a coolant supply header 310 and coolant return header 320. Coolant is supplied to the multiple coolant supply and return headers, 310, 320 via respective facility coolant supply and return lines 305 and 306.

Figure 4:
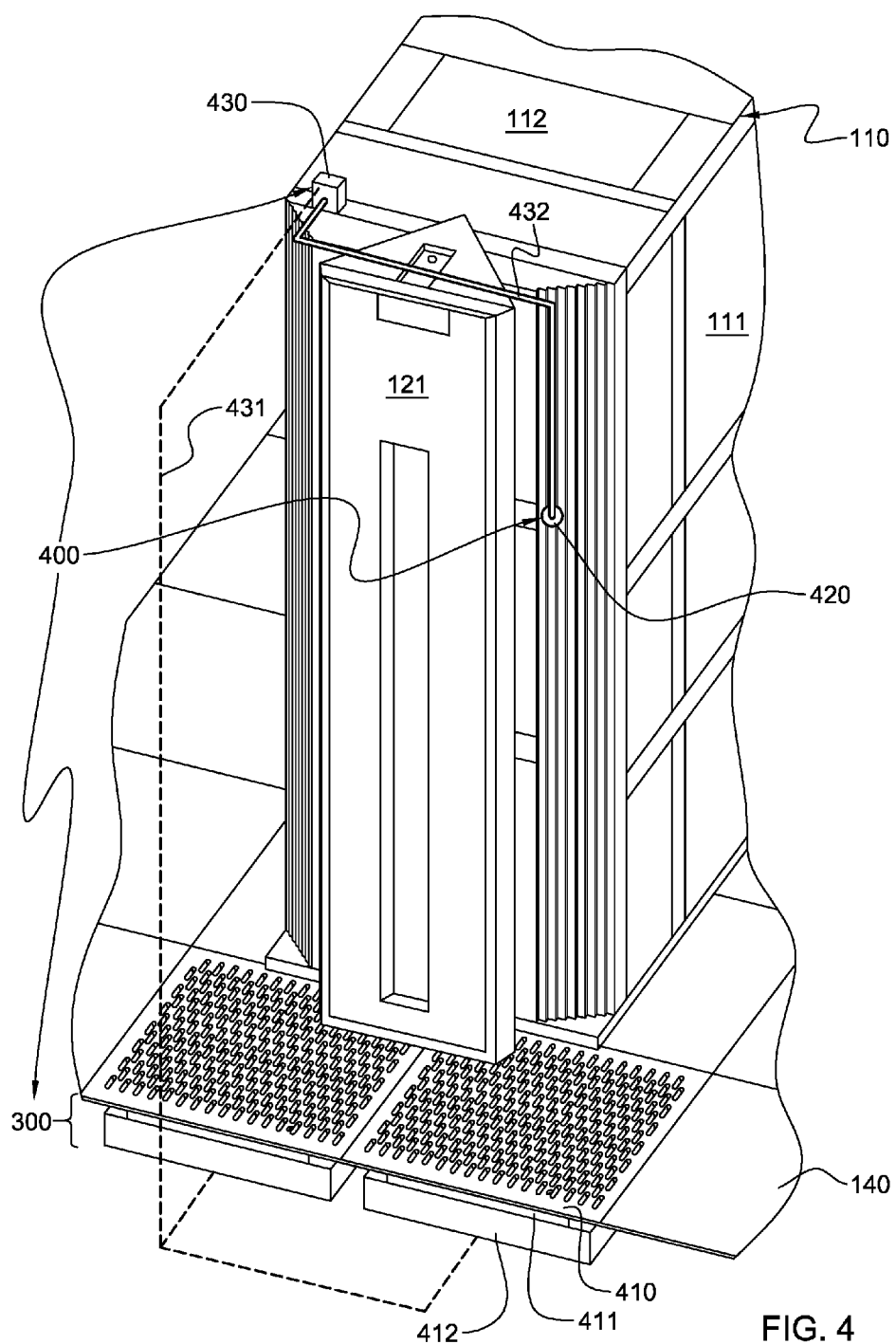
FIG. 4 is a partial isometric view of one embodiment of an electronics rack and an apparatus for facilitating air cooling of the electronics rack, in accordance with an aspect of the present invention.

FIG. 4 is a partial view of one embodiment of an electronics rack 110 and an apparatus 400 for facilitating air cooling thereof, in accordance with an aspect of the present invention. As shown, electronics rack 110 includes a rack side 111, a rack top 112 and a louvered air inlet cover or door 121 through which cool air passes for air cooling electronic components within electronics rack 110.

Apparatus 400 includes a tile assembly 300, one or more temperature sensors 420, such as one or more thermocouples, and a controller (or control unit) 430. Tile assembly 300 includes a perforated tile 410, an air-to-liquid heat exchanger 411, and one or more air-moving devices 412. In the illustrated embodiment, temperature sensor 420 is disposed at a upper portion of louvered air inlet cover 121, and controller 430 is positioned on rack top 112. These positionings are provided by way of example only. Further, multiple temperature sensors may be employed at the air inlet side or air outlet side of electronics rack 110, or even within electronics rack 110, if desired. A control/data cable 431 couples controller 430 to, for example, a variable frequency drive of each air-moving device 412 of tile assembly 300. A temperature data cable 432 feeds temperature data from temperature sensor 420 back to controller 430.

In the depicted example, two tile assemblies 300 are illustrated within raised floor 140 at the air inlet side of electronics rack 110. One or more than two tile assemblies could alternatively be positioned before the electronics rack to facilitate air cooling thereof. Airflow through tile assemblies 300 can be separately controlled based on temperature sensed by the one or more temperature sensors, thereby allowing customization of the cool airflow to the air inlet side of each electronics rack within the data center. Also, if desired, one or more temperature sensors could also be provided within or adjacent to the respective tile assemblies 300 to monitor air temperature exiting the tile assemblies, and thereby provide additional feedback to controller 430 for control of cool airflow through the tile assemblies. In addition, the one or more temperature sensors 420 can be positioned differently for different applications. Positioning of temperature sensor 420 at the upper portion of the air inlet side of the electronics rack is beneficial when hot air recirculation at the upper portion of the electronics rack is an issue.

Figure 5A:
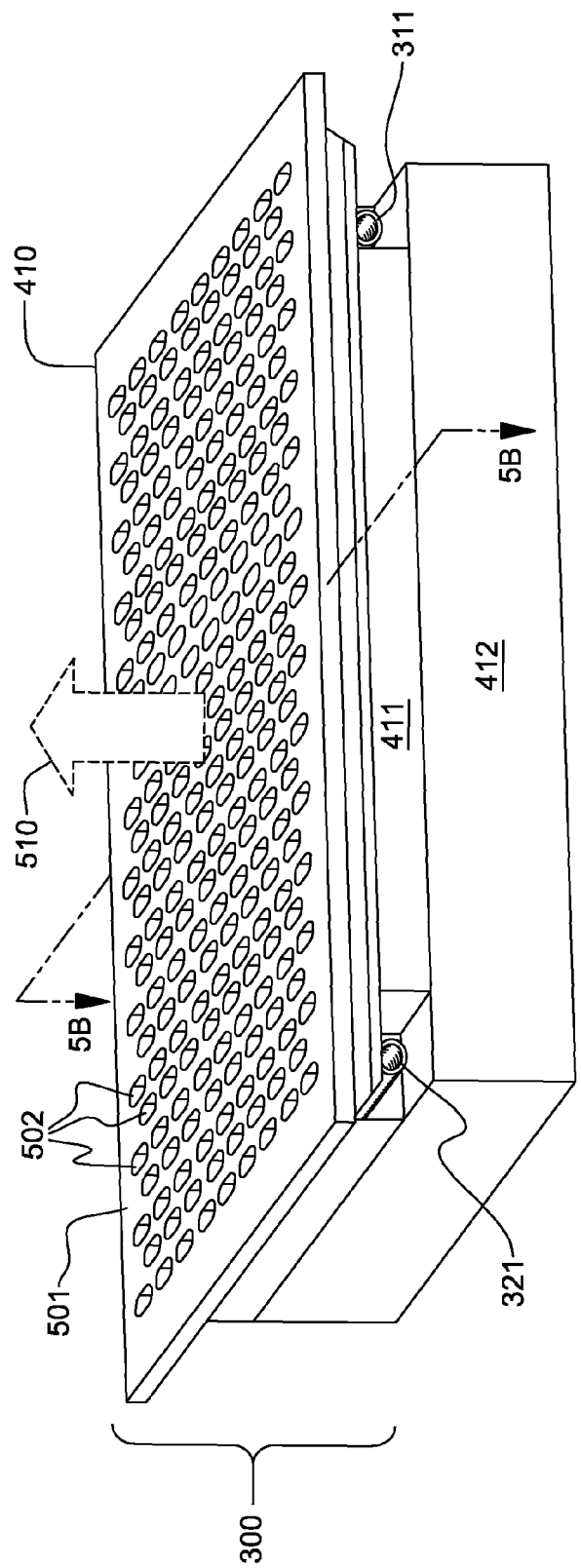
FIG. 5A is an isometric view of one embodiment of a tile assembly 300, in accordance with an aspect of the present invention.
Figure 5B:
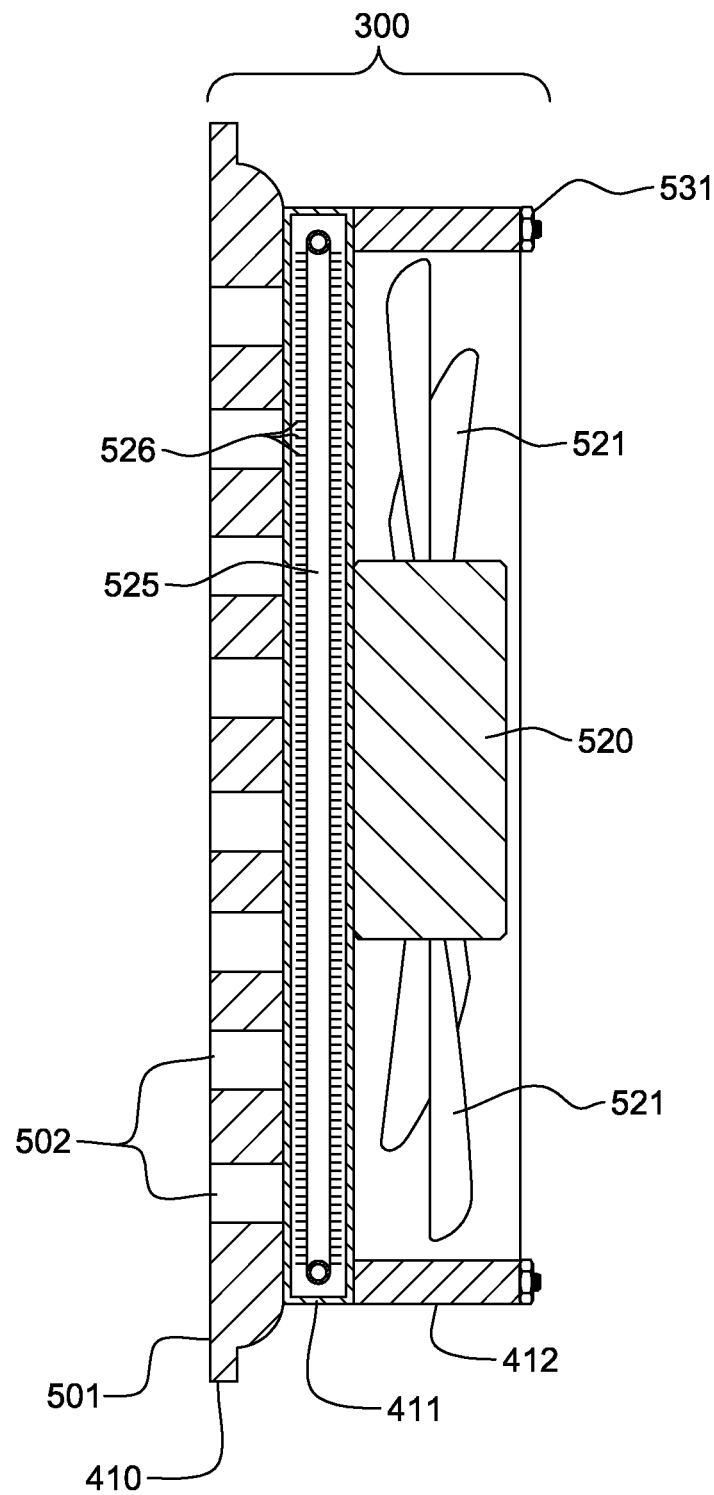
FIG. 5B is a cross-sectional view of the tile assembly of FIG. 5A, taken along 5B-5B, in accordance with an aspect of the present invention.
Figure 5C:
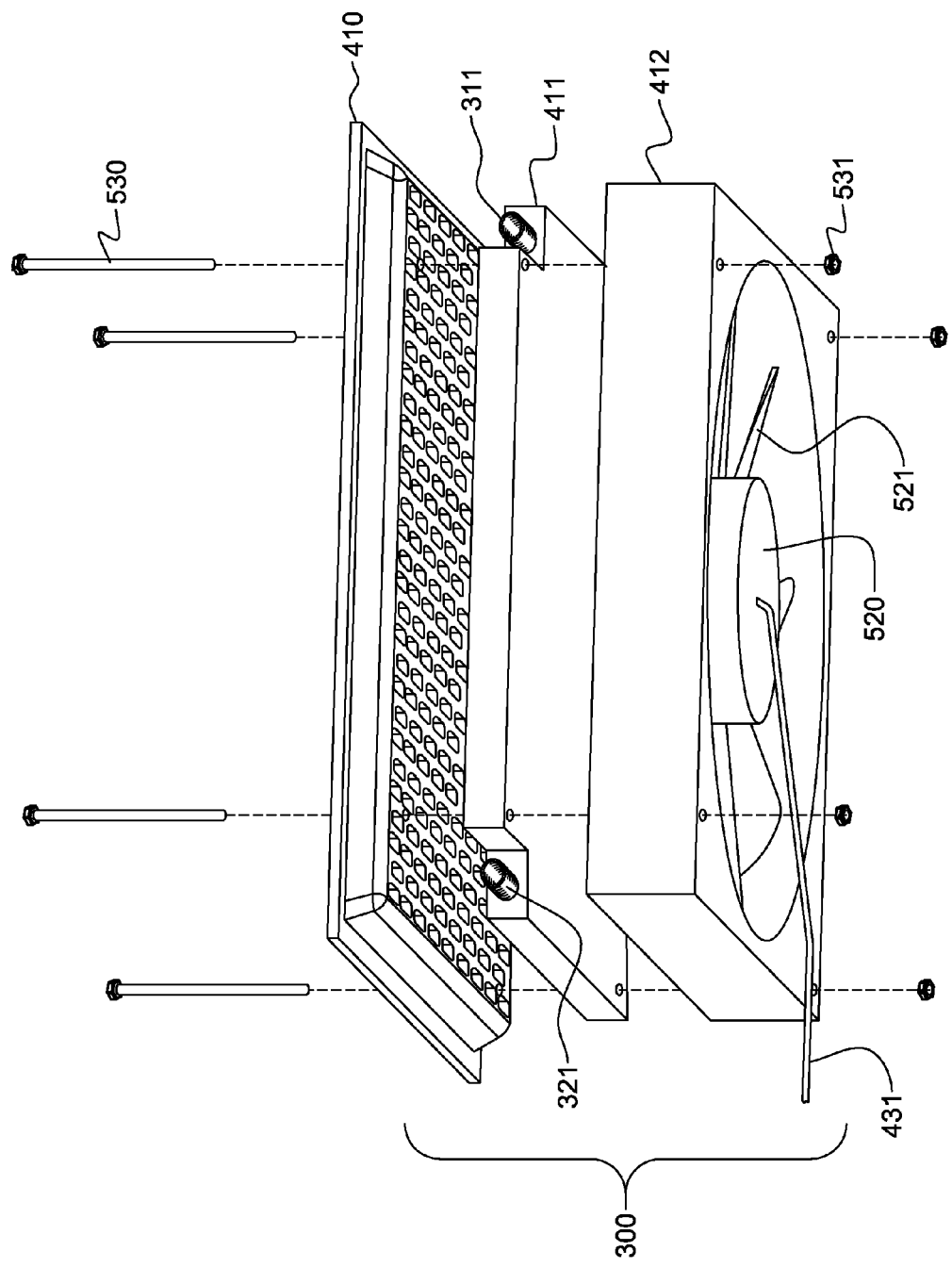
FIG. 5C is a partially exploded view of the tile assembly of FIGS. 5A & 5B, in accordance with an aspect of the present invention.

FIGS. 5A-5C illustrate one detailed embodiment of tile assembly 300. Referring collectively to these figures, tile assembly 300 comprises, in one embodiment, perforated tile 410, air-to-liquid heat exchanger 411 and one or more air-moving devices 412. Airflow 510 forced through tile assembly 300 by air-moving device 412 undergoes cooling crossing air-to-liquid heat exchanger 411, Air-to-liquid heat exchanger 411 is sized to the air-moving devices(s) 412, and includes coolant inlet port 311, coolant outlet port 321, and a coolant inlet plenum in fluid communication with coolant inlet port 311 and a coolant outlet plenum in fluid communication with coolant outlet port 321. One or more coolant-carrying tubes 525 interconnect the coolant inlet and coolant outlet plenums. A plurality of thermally conductive fins 526 are coupled to coolant-carrying tubes 525 and facilitate extraction of heat from air passing across the air-to-liquid heat exchanger.

Airflow 510 exits through openings 502 in a solid structural portion 501 of perforated tile 410. Air is forced through tile assembly 300 by air-moving device 412, which includes (in one embodiment) a variable frequency drive (VFD) motor 520 and a plurality of fan blades 521 rotationally driven thereby. As one example, VFD motor 520 is connected by control cable 431 back to controller 430 (FIG. 4), which controls the rotational speed of the air-moving device. The perforated tile, air-to-liquid heat exchanger and air-moving device of tile assembly 300 may be secured together (e.g., using bolts 530 and nuts 531) along the peripheries thereof using aligned openings through the components.

Figure 6:
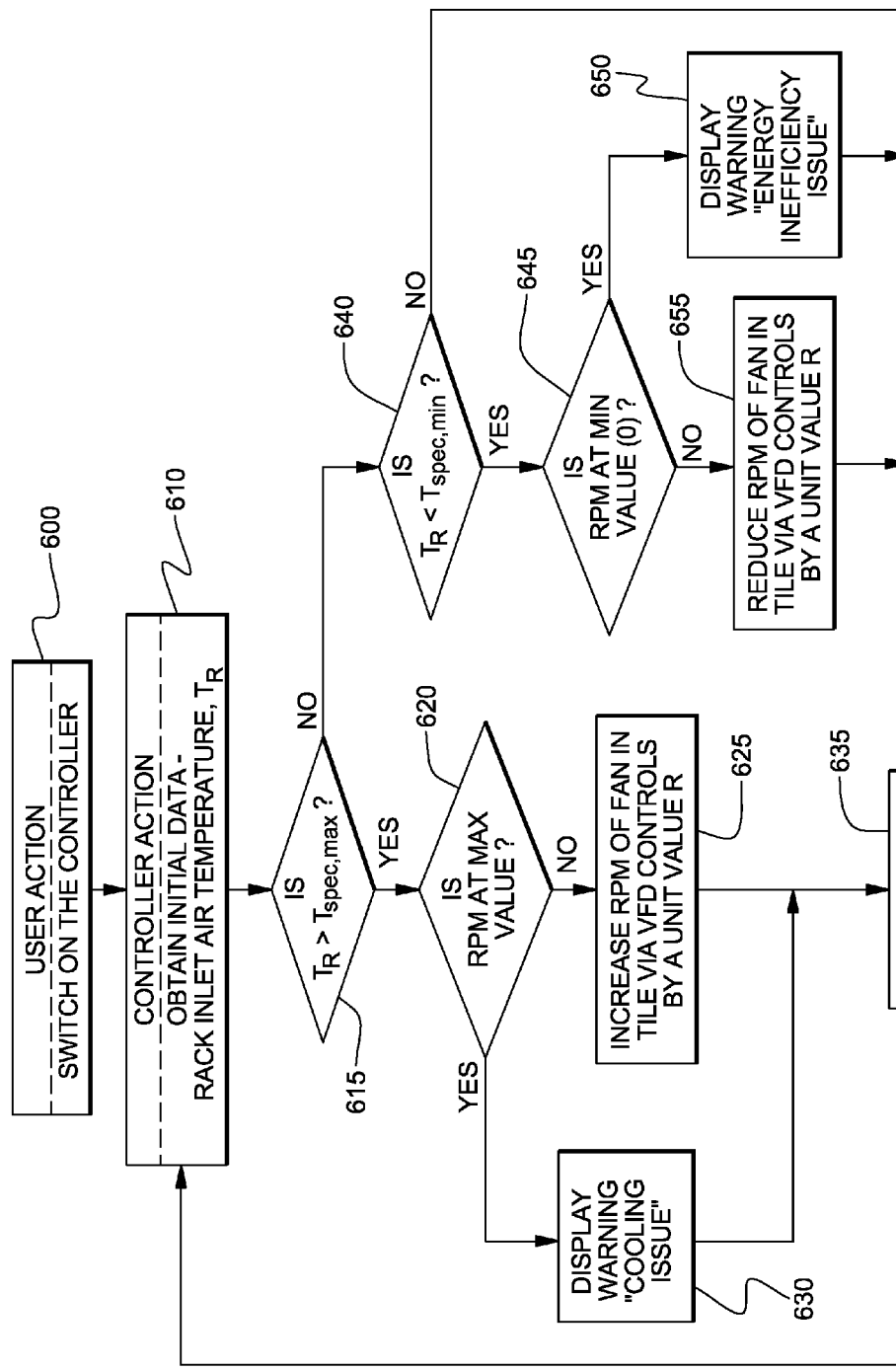
FIG. 6 is a flowchart of one embodiment of processing implemented by the controller of the apparatus of FIG. 4, in accordance with an aspect of the present invention.

FIG. 6 depicts one embodiment of processing implemented by controller 430 (FIG. 4). Initially, a user switches on or otherwise activates the controller (or control unit) 600. Responsive to this action, the controller obtains initial data which includes, for example, an air temperature value $T_R$ at the air inlet side of the associated electronics rack to be air-cooled 610. One or more other sensed air temperature values may alternatively or additionally be employed. In each case, however, the sensed air temperature is adjacent to or within the electronics rack in order that the controller can customize the volume of cool airflow adjacent to the particular electronics rack.

The controller determines whether the sensed air temperature $T_R$ is greater than a specified maximum desirable air temperature $T_{spec,max}$ 615. If so, then the controller adjusts the rotational speed (e.g., RPMs) of the air-moving device (if possible). The controller initially determines whether the rotational speed of the associated air-moving device(s) is at a maximum value 620. If no, then the rotational speed of the air-moving device is increased in the tile assembly associated with that electronics rack, for example, employing variable frequency drive control over the air-moving device 625. As one example, the increase in rotational speed may be by a set unit value R. By way of example, a typical value for R might be in the 100-2500 RPM range, and will depend on the designed airflow rate range and whether there is a single or multiple air-moving devices. If the rotational speed of the air-moving device in the associated tile assembly (or assemblies) is already at a maximum value, then the controller outputs (e.g., signals or displays) a "cooling issue" warning 630. This warning could be issued at a central location within the data center, or at the controller itself, using an appropriate display mechanism. After outputting the warning, or increasing the RPMs of the air-moving device, processing waits a set time $t_1$ 635, before obtaining a next rack inlet air temperature reading 610.

If the rack inlet air temperature is less than the specified maximum temperature, then the controller determines whether the sensed air temperature $T_R$ is less than a specified minimum desirable air temperature ($T_{spec, min}$) 640. If "no", then the controller waits time $t_1$ 635 before obtaining a next air temperature reading (thus maintaining the current rotational speed of the air-moving device). If however the sensed air temperature $T_R$ is less than the specified minimum desirable air temperature ($T_{spec, min}$), the controller determines whether the rotational speed of the air-moving device is at a minimum value 645. If yes, then an "energy inefficiency issue" warning is output (e.g., signaled or displayed) 650. Again, this display could be at a central location within the data center, or at the controller itself. If the rotational speed of the air-moving device is not at a minimum value, then the controller reduces the rotational speed of the air-moving device(s) in the associated tile assemblies by adjusting, for example, the variable frequency drive associated therewith by unit value R 655, and waits for time $t_1$ 635, before obtaining a next sensed air temperature value and again determining whether the sensed air temperature is below the specified minimum temperature threshold ($T_{spec, min}$).

FIGS. 7A-7C depict an alternate embodiment of a tile assembly 700, in accordance with an aspect of the present invention. Referring collectively to FIGS. 7A-7C, tile assembly 700 includes a perforated tile 710, an air-to-liquid heat exchanger 720 and an air-moving device 730. As illustrated, air-to-liquid heat exchanger 720 is sized to air-moving device 730, and perforated tile 710 has a solid structural portion 711 and multiple airflow openings 712 within solid structural portion 711 to allow air 760 to pass through the tile.

Air-to-liquid heat exchanger 720 includes a coolant inlet port 721, in fluid communication with a coolant inlet plenum 723, and a coolant outlet port 722, in fluid communication with coolant outlet plenum 724. Coolant inlet plenum 723 and coolant outlet plenum 724 are coupled via a plurality of coolant-carrying tubes 725. Each coolant-carrying tube 725 comprises a channel which includes an inlet in fluid communication with coolant inlet plenum 723, and an outlet in fluid communication with coolant outlet plenum 724. Coolant flows 740 through coolant-carrying tubes 725 from the coolant inlet plenum to the coolant outlet plenum. A plurality of thermally-conductive fins 726 are coupled to coolant-carrying tubes 725 for facilitating transfer of heat from air passing across the heat exchanger to coolant flowing through the heat exchanger.

Air-moving device 730 includes a VFD motor 731 and multiple fan blades 735. As described above, VFD motor 731 is controllable to allow the rotational speed of fan blades 735 to be increased or decreased (e.g., via a selected increment such as unit value R). By increasing or decreasing the rotational speed, the amount of air 750 drawn into tile assembly 700 is adjusted. Adjustment of airflow through the tile assembly is based on one or more sensed air temperatures, for example, at the air inlet side of the associated electronics rack. As with the tile assembly described above in connection FIGS. 3-6, tile assembly 700 is configured for disposition adjacent to the air inlet side of one or more electronics racks. In one data center embodiment, each electronics rack has at least one respective tile assembly associated therewith for facilitating separate control of the cool airflow provided adjacent to the air inlet side thereof.

Figure 8:
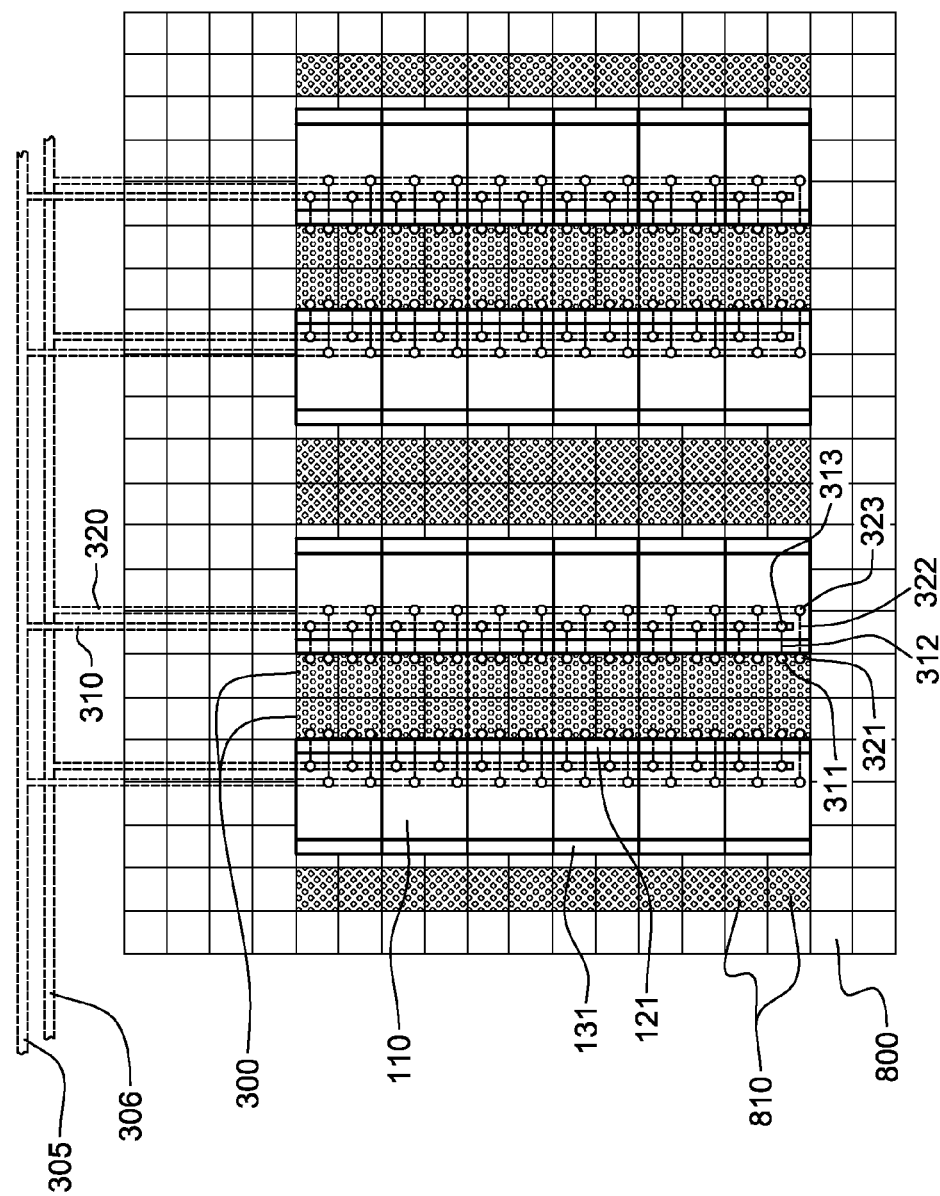
FIG. 8 is a plan view of an alternate embodiment of a raised floor layout of a data center, in accordance with an aspect of the present invention.

FIG. 8 depicts an alternate implementation of a data center, in accordance with an aspect to the invention. In this alternate implementation, the data center includes a raised floor 800, as one example, but lacks computer room air-conditioning units (e.g., air-conditioning units 150 of the data center of FIG. 3). Thus, air drawn from an under-floor plenum and provided to the air inlet sides of the electronics racks is cooled only by the air-to-liquid heat exchangers within the respective tile assemblies 300.

As shown in FIG. 8, the data center includes a plurality of electronics racks 110 aligned in multiple rows on raised floor 800. Cool air is taken in through louvered air inlet covers or doors 121 of the electronics racks and hot air is expelled through louvered air outlet covers or doors 131. Each electronics rack may have an air-moving device (not shown) providing forced inlet-to-outlet airflow to cool the electronic components within the electronics rack. Air is supplied from the under-floor plenum through tile assemblies 300. As the air passes through the respective tile assemblies, the air-to-liquid heat exchangers thereof cool the air. The air-to-liquid heat exchangers of the respective tile assemblies include coolant inlet ports 311 and coolant outlet ports 321, which are connected via appropriate coolant lines 312, 322 to supply header ports 313 and return header ports 323 provided within coolant supply header 310 and coolant return header 320, respectively. The coolant supply and return headers 310, 320 couple to facility coolant supply line 305 and facility coolant return line 306.

In the embodiment illustrated, perforated tiles 810 are disposed adjacent to the air outlet sides of the respective electronics racks to allow airflow through the electronics racks to be returned to the under-floor air plenum near the electronics racks. Placement of perforated tiles 810 adjacent to the air outlet sides of the electronics racks reduces the pressure drop for air drawn from the under-floor plenum.

Figure 9:
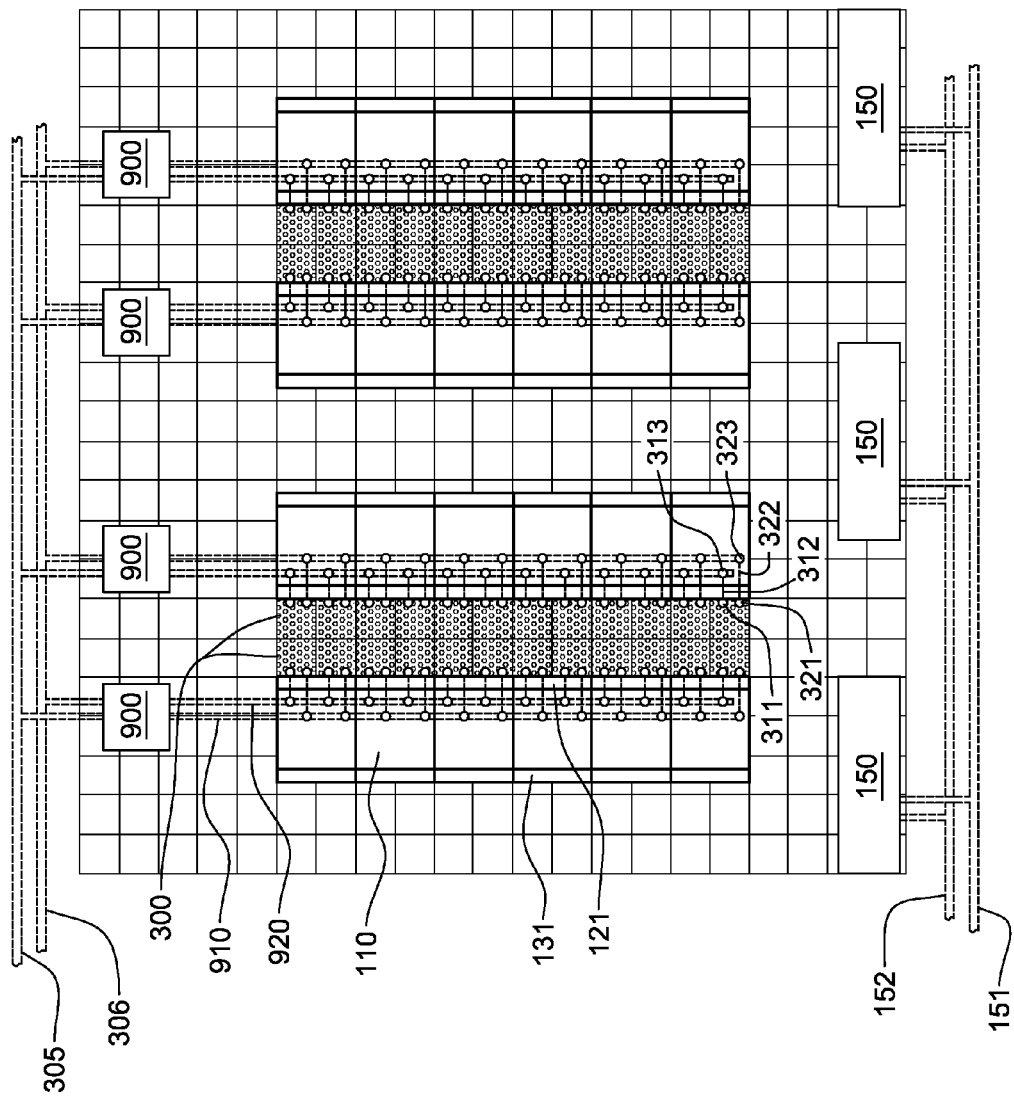
FIG. 9 depicts another alternate embodiment of a raised floor layout of a data center, in accordance with an aspect of the present invention.

FIG. 9 depicts a further variation on the air cooling concepts described herein. In this embodiment, coolant distribution units 900 are added to the data center of FIG. 3 to buffer the air-to-liquid heat exchangers of the tile assemblies 300 from, for example, facility coolant provided via facility coolant supply line 305 and facility coolant return line 306. Each coolant distribution unit 900 comprises, for example, a liquid-to-liquid heat exchanger, which extracts heat from coolant returned by a respective coolant return header 920, and provides cooled coolant via coolant supply headers 910 to the air-to-liquid heat exchangers of the tile assemblies. Coolant distribution units 900 advantageously provide coolant that is of a controlled temperature, pressure and quality to the respective air-to-liquid heat exchangers. The use of multiple coolant distribution units 900 allows customization of the coolant flow through the tile assemblies associated with the different rows of electronics racks. For example, one coolant distribution unit may provide system coolant at a lower temperature to the air-to-liquid heat exchangers coupled thereto than another coolant distribution unit, thus customizing the air cooling supplied to the different rows of electronics racks.

As in the data center embodiments of FIGS. 3 & 8, cool air is taken in through louvered air inlet covers or doors 121 in electronics racks 110 and hot air is exhausted through louvered air outlet covers or doors 131. The cool air is provided, in one example, via a cold air plenum disposed below a raised floor of the data center upon which the electronics racks reside. Multiple air-conditioning units 150 provide conditioned and cooled air to the cold air plenum below the raised floor. Heat from the data center air is extracted by air-conditioning units 150 and transferred to liquid coolant passing therethrough provided via facility coolant supply and return lines 151, 152.

The individual air-to-liquid heat exchangers of the tile assemblies 300 include coolant inlet ports 311 and coolant outlet ports 321, which are respectively coupled via appropriate coolant lines 312, 322 to supply header ports 313 and return header ports 323 in the supply and return headers 910, 920, which as noted are coupled to a respective coolant distribution unit 900.

Advantageously, disclosed herein are an apparatus and method which facilitate provision of cool air at a desired temperature and airflow rate to each electronics rack within a data center. Depending on the implementation, the air-to-liquid heat exchangers within the tile assemblies may be employed or not. If not needed, then rotational speed of the air-moving device is adjusted to regulate cold airflow to the air inlet side of the respective electronics rack to be air-cooled. By increasing the rotational speed of the air-moving device, additional cold airflow is provided to the air inlet side of the electronics rack.

The air-to-liquid heat exchanger is advantageously employed within the tile assembly where insufficient cold air is provided via, for example, an under-floor plenum. In such a data center, cooling of the airflow provided to the air inlet side of the electronics rack is enhanced by the air-to-liquid heat exchanger. If desired, coolant control valves could be provided for controlling the amount of coolant flow to the air-to-liquid heat exchangers of the tile assemblies, and thereby further control the amount of cooling applied to air passing across the air-to-liquid heat exchanger.

The detailed description presented above is discussed in part in terms of procedures which may be executed on a computer, a network or a cluster of computers. These procedural descriptions and representations are used by those skilled in the art to most effectively convey the substance of their work to others skilled in the art. They may be implemented in hardware or software, or a combination of the two A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; various operations described herein may be automatic machine operations. Useful machines for performing the operations of the present invention include general purpose digital computers or similar devices.

Selected steps of the method may be executed on a general computer, such as a mainframe computer, personal computer or the like and pursuant to one or more, or a part of one or more, program modules or objects generated from any programming language, such as C++, Java, Fortran or the like. And still further, a step, or a file or object or the like implementing a step, may be executed by special purpose hardware or a circuit module designed for that purpose.

Aspects of the invention are implemented (in one example) in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention.

Aspects of the invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

Again, the capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus comprising:
   a cool air plenum comprising cooled air to cool a data center;
   at least one tile assembly associated with the cool air plenum, and disposed within the data center external to, an electronics rack of the data center at an air inlet side thereof, each tile assembly comprising a perforated tile and at least one air-moving device associated with and disposed parallel to the perforated tile, wherein the at least one air-moving device is adjustable to control an amount of cooled air flowing from the cool air plenum through the tile assembly at the air inlet side of the electronics rack to control a wall of cooled air flowing into ambient air of the data center parallel to the air inlet side of the electronics rack, and each tile assembly of the at least one tile assembly further comprising an air-to-liquid heat exchanger disposed parallel to and between the perforated tile and the at least one air-moving device thereof, the air-to-liquid heat exchanger being sized to the at least one air-moving device, and further cooling the cooled air passing through the tile assembly into the data center external to the electronics rack, wherein the at least one air-moving device and the air-to-liquid heat exchanger are disposed within the tile assembly upstream of the perforated tile through which the cooled air flows into the data center, the at least one air-moving device and the air-to-liquid heat exchanger residing within the cool air plenum;
   at least one temperature sensor for sensing air temperature adjacent to or within the electronics rack at the air inlet side thereof; and
   a controller coupled to the at least one tile assembly and to the at least one temperature sensor, the controller automatically identifying a recirculation of hot air from an air outlet side of the electronics rack to the air inlet side thereof based on the sensed air temperature, and controlling the at least one air-moving device to adjust the cooled airflow through the at least one tile assembly associated with the electronic rack based on the air temperature sensed by the at least one temperature sensor associated with the electronics rack to facilitate rack-level tailoring of air cooling of the electronics rack within the data center and to automatically adjust the wall of further cooled air flowing into ambient air of the data center parallel to the air inlet side of the electronics rack to disrupt the identified recirculation of hot air from the air outlet side of the electronics rack to the air inlet side thereof and to be drawn, at least in part, into the air inlet side of the electronics rack.

2. The apparatus of claim 1, wherein, subsequent to the automatically adjusting, the controller determines whether the automatically adjusting was sufficient to disrupt the identified recirculation of hot air from the air outlet side of the electronics rack to the air inlet side thereof.

3. The apparatus of claim 1, wherein the at least one tile assembly is configured to move the further cooled air through the perforated tile thereof towards an air inlet side of the electronics rack.

4. The apparatus of claim 3, wherein the controller controls the at least one air-moving device of the at least one tile assembly to increase airflow therethrough when air temperature sensed by the at least one temperature sensor is above a first temperature threshold.

5. The apparatus of claim 4, wherein the controller controls the at least one air-moving device of the at least one tile assembly to reduce airflow therethrough when air temperature sensed by the at least one temperature sensor is below a second temperature threshold.

6. The apparatus of claim 3, wherein the at least one air-moving device comprises a rotational speed attribute and the controller outputs a cooling warning if air temperature sensed by the at least one temperature sensor is above a first temperature threshold and the rotational speed attribute of the at least one air-moving device is at a maximum, and wherein the controller outputs an energy inefficiency warning if air temperature sensed by the at least one temperature sensor is below a second temperature threshold and the rotational speed attribute of the at least one air-moving device is at a minimum.

7. The apparatus of claim 3, wherein the at least one tile assembly comprises at least one floor tile assembly, and the cool air plenum is an under-floor cold air plenum.

8. The apparatus of claim 1, wherein the air-to-liquid heat exchanger of each tile assembly comprises a plurality of coolant-carrying tubes, each coolant-carrying tube extending in a first direction and being aligned to a respective solid structural member of a plurality of solid structural members of the corresponding perforated tile comprising a plurality of openings arrayed in the first direction and a second direction.

9. The apparatus of claim 1, wherein the air-to-liquid heat exchanger of each tile assembly further comprises a coolant inlet plenum, a coolant outlet plenum and multiple coolant-carrying tubes connecting the coolant inlet plenum and the coolant outlet plenum, and wherein a plurality of thermally-conductive fins extend from the plurality of the tubes to facilitate cooling of air passing across the air-to-liquid heat exchanger.

10. A data center comprising:
at least one electronics rack, each electronics rack comprising an air inlet side and an air outlet side, the air inlet and air outlet sides respectively enabling ingress and egress of air through the electronics rack;
an apparatus for facilitating tailoring of rack-level cooling of an electronics rack of the at least one electronics rack, the apparatus comprising:
a cool air plenum comprising cooled air to cool the data center;
at least one tile assembly associated with the cool air plenum, and disposed within the data center external to the at least one electronics rack at an air inlet side thereof, each tile assembly comprising a perforated tile and at least one air-moving device associated with and disposed parallel to the perforated tile for moving cooled air from the cool air plenum through the tile assembly, wherein the at least one air-moving device is adjustable to control an amount of cooled air flowing through the tile assembly at the air inlet side of the at least one electronics rack to control a wall of cooled air flowing into ambient air of the data center parallel to the air inlet side of the at least one electronics rack, and each tile assembly of the at least one tile assembly further comprising an air-to-liquid heat exchanger disposed parallel to and between the perforated tile and the at least one air-moving device thereof, the air-to-liquid heat exchanger being sized to the at least one air-moving device, and further cooling the cooled air passing through the tile assembly into the data center external to the electronics rack, wherein the at least one air-moving device and the air-to-liquid heat exchanger are disposed within the assembly upstream of the perforated tile through which the cooled air flows into the data center, the at least one air-moving device and the air-to-liquid heat exchanger residing within the cool air plenum;
at least one temperature sensor associated with the at least one electronics rack for sensing air temperature adjacent to or within the at least one electronics rack at the air inlet side thereof; and
a controller coupled to the at least one tile assembly and to the at least one temperature sensor, the controller automatically identifying a recirculation of hot air from an air outlet side of one electronics rack of the at least one electronics rack to the air inlet side thereof based on the sensed air temperature, and controlling the at least one air-moving device of a respective tile assembly of the at least one tile assembly to adjust the cooled airflow through the respective tile assembly based on the air temperature sensed by the at least one temperature sensor to facilitate rack-level tailoring of air cooling of the one electronics rack within the data center and to automatically adjust the wall of cooled air flowing into ambient air of the data center parallel to the air inlet side of the one electronics rack to disrupt the identified recirculation of hot air from the air outlet side of the one electronics rack to the air inlet side thereof and to be drawn, at least in part, into the air inlet side of the electronics rack.

11. The apparatus of claim 10, wherein the at least one air-moving device comprises a controllable rotational speed attribute, the rotational speed attribute being controlled by the controller to increase airflow through the at least one tile when air temperature sensed by the at least one temperature sensor is above a first temperature threshold, or to decrease airflow through the at least one tile assembly when air temperature sensed by the at least one temperature sensor is below a second temperature threshold.

12. The data center of claim 10, wherein the at least one tile assembly comprises at least one floor tile assembly,-and the cool air plenum is an under-floor cold air plenum.

13. The data center of claim 10, wherein the air-to-liquid heat exchanger of each tile assembly comprises a plurality of coolant-carrying tubes, each coolant-carrying tube extending in a first direction and being aligned to a respective solid structural member of a plurality of solid structural members of the corresponding perforated tile comprising a plurality of openings arrayed in the first direction and a second direction.

14. The data center of claim 10, wherein the at least one temperature sensor is aligned to an upper portion of the electronics rack for sensing air temperature at the upper portion of the air inlet side of the electronics rack, and wherein the at least one air-moving device of the respective tile assembly comprises a controllable rotational speed attribute, the rotational speed attribute being controlled by the controller to adjust the wall of cool air flowing into to the ambient air of the data center to block recirculation of hot air from the air outlet side of the electronics rack from reaching the air inlet side of the electronics rack.

15. A method of tailoring rack-level air cooling of an electronics rack of a data center, the method comprising:
providing within the data center a cool air plenum comprising cooled air to cool the data center;
disposing within the data center at least one tile assembly external to and in association with the electronics rack at an air inlet side thereof, each tile assembly comprising a perforated tile and at least one air-moving device associated with and disposed parallel to the perforated tile for moving cooled air from the cool air plenum through the perforated tile, wherein the at least one air-moving device comprises a controllable attribute for adjusting an amount of cooled air flowing through the tile assembly at the air inlet side of the electronics rack to control a wall of cool air flowing into ambient air of the data center parallel to the air inlet side of the electronics rack, and each tile assembly of the at least one tile assembly further comprising an air-to-liquid heat exchanger disposed parallel to and between the perforated tile and the at least one air-moving device thereof, the air-to-liquid heat exchanger being sized to the at least one air-moving device, and further cooling the cooled air passing through the tile assembly into the data center external to the electronics rack, wherein the at least one air-moving device and the air-to-liquid heat exchanger are disposed within the tile assembly upstream of the perforated tile through which the cooled air flows into the data center, the at least one air-moving device and the air-to-liquid heat exchanger residing within the cool air plenum;
sensing air temperature associated with the electronics rack adjacent to or within the electronics rack at the air inlet side thereof; and automatically controlling airflow through the at least one tile assembly associated with the electronics rack by automatically identifying a recirculation of hot air from an air outlet side of the electronics rack to the air inlet side thereof based on the sensed air temperature, and adjusting the controllable attribute of the at least one air-moving device based on air temperature sensed adjacent to or within the electronics rack to facilitate rack-level tailoring of air cooling of the electronics rack within the data center and to automatically adjust the wall of cool air flowing into ambient air of the data center parallel to the air inlet side of the electronics rack to disrupt the identified recirculation of hot air from the air outlet side of the electronics rack to the air inlet side thereof and to be drawn, at least in part, into the air inlet side of the electronics rack.

16. The method of claim 15, wherein the controllable attribute comprises a controllable rotational speed attribute of the at least one air-moving device, and wherein the method further comprises increasing rotational speed of the at least one air-moving device to increase airflow through the at least one tile assembly when air temperature sensed by the at least one temperature sensor is above a first temperature threshold to block recirculation of hot air from an air outlet side of the electronics rack from reaching the air inlet side of the electronics rack, or decreasing rotational speed of the at least one air-moving device to decrease airflow through the at least one tile assembly when air temperature sensed by the at least one temperature sensor is below a second temperature threshold.

17. The method of claim 16, further comprising outputting a cooling warning signal if air temperature sensed by the at least one temperature sensor is above the first temperature threshold and the rotational speed attribute of the at least one air-moving device is at a maximum, or outputting an energy inefficiency warning signal if air temperature sensed by the at least one temperature sensor is below the second temperature threshold and the rotational speed attribute of the at least one air-moving device is at a minimum.

18. The method of claim 15, wherein the at least one tile assembly comprises at least one floor tile assembly, and the cool air plenum is an under-floor cold air plenum.

\* \* \* \* \*